United States Patent [19]

Verret

[11] Patent Number: 5,065,217

[45] Date of Patent: Nov. 12, 1991

[54] PROCESS FOR SIMULTANEOUSLY FABRICATING ISOLATION STRUCTURES FOR BIPOLAR AND CMOS CIRCUITS

[75] Inventor: Douglas P. Verret, Sugarland, Tex.

[73] Assignee: Texas Instruments Incorporated, Dallas, Tex.

[21] Appl. No.: 630,374

[22] Filed: Dec. 18, 1990

Related U.S. Application Data

[63] Continuation of Ser. No. 544,812, Jun. 27, 1990, abandoned, which is a continuation of Ser. No. 131,496, Dec. 10, 1987, abandoned.

[51] Int. Cl.$^5$ ............................................. H01L 27/12
[52] U.S. Cl. ..................................................... 357/49
[58] Field of Search .............................. 357/49, 47, 59

[56] References Cited

U.S. PATENT DOCUMENTS

| | | | |
|---|---|---|---|
| 4,507,158 | 3/1985 | Kamins et al. | 357/49 |
| 4,509,249 | 4/1985 | Goto et al. | 357/49 |
| 4,547,793 | 10/1985 | Bergeron | 357/49 |
| 4,666,556 | 5/1987 | Fulton et al. | 357/49 |

OTHER PUBLICATIONS

Healy; "Integrated Semiconductor Device"; IBM Technical Disclosure Bulletin, vol. 8, No. 7; 12/1965; pp. 1016–1017.
Abbas; "Recessed Oxide Isolation Process"; IBM Technical Disclosure Bulletin, vol. 20, No. 1; 06/1977; pp. 144–145.
Abbas; "Silicon on Polysilicon with Deep Dielectric Isolation"; IBM Technical Disclosure Bulletin, vol. 22, No. 7; 12/1979; pp. 2754–2755.
"Sputtered Silcion Process for Trench Isolation"; IBM Technical Disclosure Bulletin, vol. 27, No. 10A; 03/1985; pp. 5497–5498.
"Trench-Isolation Structure", IBM Technical Disclosure Bulletin, vol. 27, No. 12; 05/1985; pp. 6981–6982.
"Methods – – – Polysilicon Trench Fill in Semiconductor Devices"; IBM Technical Disclosure Bulletin, vol. 30, No. 10; 03.1988; pp. 156–158. 6

Primary Examiner—Frank Gonzalez
Attorney, Agent, or Firm—B. Peter Barndt; James T. Comfort; Melvin Sharp

[57] ABSTRACT

An isolation structure for bipolar and CMOS circuits formed during the same processing steps to optimize the integration of bipolar and CMOS circuits. A deep trench (46) is formed in a semiconductor circuit for providing deep isolation for bipolar circuits. A shallow recess (56) is then formed simultaneous with a stepped sidewall structure of the deep trench. The recess (56) and the trench (46) are covered by an insulating oxide (60), and thereafter filled with an undoped polysilicon (62) to form the different isolating structures for the different types of circuits.

20 Claims, 2 Drawing Sheets

PROCESS FOR SIMULTANEOUSLY FABRICATING ISOLATION STRUCTURES FOR BIPOLAR AND CMOS CIRCUITS

This application is a continuation of application Ser. No. 07/544,812, filed June 27, 1990, (now abandoned) which is a continuation of 7/131,496 filed on Dec. 10, 1987, now abandoned.

TECHNICAL FIELD OF THE INVENTION

The present invention relates in general to semiconductor processing techniques for fabricating circuit isolation structures, and more particularly relates to trench type isolation structures.

BACKGROUND OF THE INVENTION

Continued efforts are directed toward the miniaturization of circuits so that more and more devices can be fabricated on a single chip or wafer. This applies both to MOS-type circuits, such as CMOS circuits, as well as to bipolar circuits. Indeed, there exists many applications in which both CMOS and bipolar circuits are utilized on the same chip. However, the integration of the bipolar and CMOS (BiCMOS) family of circuits is not easily accomplished, because of the diverse fabrication steps generally required by each such type of circuit. Heretofore, the integration of CMOS and bipolar circuits has been generally implemented by first fabricating one circuit type, and then the other. As can be appreciated, the processing of such type of wafer becomes extremely complicated due to the number and the complexity of steps.

Not only are the circuit fabricating steps of a BiCMOS circuit made complex due to the integration of each family of circuit, but the circuit isolation techniques have also become more complex. For example, the PMOS and NMOS devices of a CMOS circuit are typically isolated by thick field oxide structures. These surface planar transistor devices are readily adapted for isolation by the field oxide. A popular type of isolation for vertical bipolar transistors comprises deep trench isolation structures. When combining the CMOS and bipolar circuit families, it has been advantageous and an expedient technique to first fabricate the thick field oxide insulation for the CMOS circuits, and thereafter fabricate the trench isolation structures for the bipolar section of the chip, or vice versa. Aside from requiring a large number of processing steps for fabricating the field oxide and trench isolation structures, the field oxide structures which isolate CMOS devices yet require a substantial amount of lateral wafer area, due to "bird's beak" and "bird's head" extensions. These noted lateral extensions tend to encroach upon adjacent circuits, and thus the designer must take special precautions in spacing the active or passive circuits a prescribed distance away from the field oxide isolation pattern.

From the foregoing, it can be seen that a need exists for an improved technique for simultaneously fabricating bipolar and CMOS isolation structures. A further need exists for a CMOS isolation structure which alleviates encroachment problems, thereby allowing circuits to be more densely packed together. Yet another need exists for a circuit isolation technique which minimizes the fabrication steps and reduces the complexity of the overall process, but which yet utilizes conventional silicon fabrication steps.

SUMMARY OF THE INVENTION

In accordance with the present invention, an improved circuit isolation technique is disclosed which reduces or substantially eliminates the disadvantages and shortcomings associated with the prior art techniques. According to the invention, the same general process steps and materials are utilized for forming deep isolation structures for use with bipolar circuits, and shallower isolation structures for use with CMOS circuits.

In accordance with the preferred embodiment of the invention, a silicon nitride mask layer and a photoresist layer are deposited on a wafer and patterned for defining deep trench openings for bipolar circuits, and shallower isolation structure openings for CMOS circuits. The wafer is then anisotropically etched to first form deep trenches aligned with the photoresist areas. After removal of the photoresist, the wafer is again etched to form shallow recesses in the wafer for the CMOS isolation. During the second etch step, the isolation trenches are etched deeper to the final depth.

The silicon nitride is removed, as well as the sacrificial oxide layer, whereupon the wafer is oxidized to form a thin layer of silicon oxide on the surfaces of the shallow recess and the deep trench. Next, a layer of undoped polycrystalline silicon (polysilicon) is conformally deposited over the wafer, thereby filling the shallow recesses and the deep trenches. The wafer can be planarized to remove the surface oxide and polysilicon layers, thereby forming an oxide/polysilicon shallow recess, as well as an oxide/polysilicon deep trench for use in isolating the CMOS and bipolar devices.

BRIEF DESCRIPTION OF THE DRAWINGS

Further features and advantages will become more apparent from the following and more particular description of the preferred embodiment of the invention, as illustrated in the accompanying drawings in which like reference characters generally refer to the same parts, regions or elements throughout the views, and in which.

DETAILED DESCRIPTION OF THE INVENTION

Figure 1:
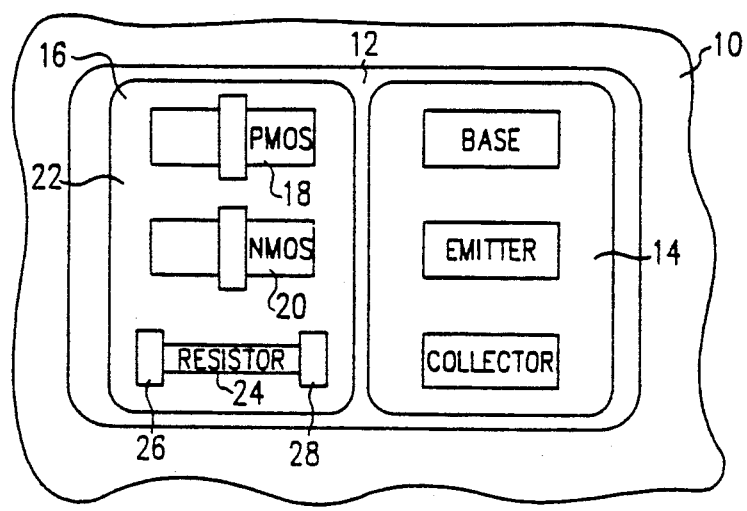
FIG. 1 is top layout view of a portion of a chip having integrated therein isolated bipolar and CMOS circuits.

FIG. 1 illustrates, for purposes of example only, an application in which electrical isolation is required in the integration of CMOS and bipolar circuits. It is to be understood, however, that each of the principles and concepts of the invention, as described in detailed below, can be applied individually, or together, in many other applications. In the example, there is formed in a semiconductor wafer 10 a deep trench isolation structure 12 for isolating a bipolar device in a semiconductor tank 14 from CMOS devices in semiconductor area 16. Semiconductor area 16 is in practice formed with P and N-type wells therein to accommodate the PMOS and NMOS devices. The trench 12 circumscribes both the bipolar devices in tank 14 and the CMOS devices in tank 16 to provide electrical isolation between such devices, as well as isolation between other devices on the wafer 10. The bipolar devices in tank 14 may comprise a vertical NPN transistor having the noted base, emitter and collector elements. In addition, three sides of the bipolar transistor collector and the base, as well as two sides of the emitter may be walled by the trench isolation 12. The CMOS circuit 16 may comprise a PMOS transistor 18 and an NMOS transistor 20, each isolated from the other by a shallower type of oxide isolation 22. Traditionally, such oxide isolation 22 comprises a LOCOS (local oxidation of silicon) processed isolation structure. The CMOS devices in tank 16 may additionally include a resistor 24 fabricated by appropriately doping a silicon material. The resistor 24 includes resistor leads and electrical contacts 26 and 28.

The MOS-type devices formed in the appropriate tanks or wells in the circuit area 16 are surface operating devices and thereby require a shallow isolation, normally only about 0.4–0.8, microns thick. On the other hand, bipolar devices, and especially the high performance NPN devices, are vertical operating devices and thus are fabricated so as to require more vertical wafer area. Hence, the bipolar devices require isolation structures which may extend into the semiconductor wafer up to eight microns, or more. It can be appreciated that due to the diversity of the circuit elements, the integration of bipolar and MOS or CMOS circuits is not easily accomplished.

Figure 2:
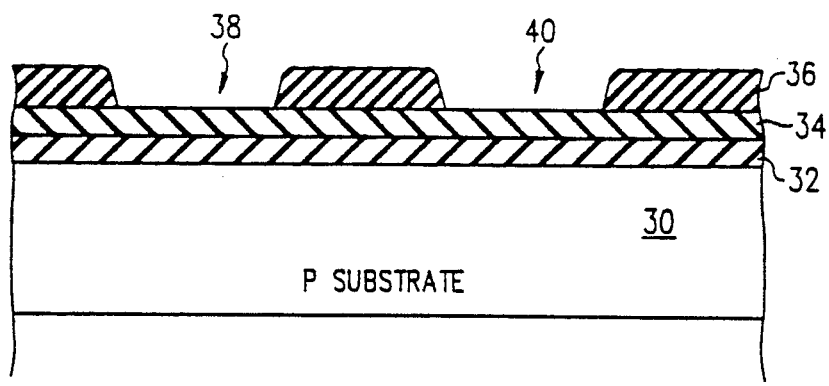
FIGS. 2-7 are sectional views illustrating a semiconductor wafer during various steps in which the CMOS isolation structures and the bipolar isolation structures are formed.

With the foregoing in mind, the advantages and features of the invention described below will be more readily understood and appreciated. Turning now to FIG. 2, there is illustrated a cross-sectional view of an exemplary semiconductor wafer during the initial stages of the fabrication of the isolation structures. Particularly, shown is a substrate 30 having an impurity type and concentration suitable for fabricating therein both CMOS and bipolar devices. Typically, the substrate would comprise a P-type silicon semiconductor material of about 6–40 ohm-cm resistivity. Formed on the surface of the substrate 30 is a layer of silicon oxide 32 which functions as a sacrificial material layer during the various etching steps of the process and buffers the silicon from potential damage from subsequent film depositions. The silicon oxide layer 32 may be formed by conventional deposition techniques, or by subjecting the wafer to a silicon oxidizing ambient. A sacrificial oxide depth of about 3,000 angstroms is sufficient for most purposes. Deposited over the sacrificial oxide layer 32 is a layer 34 of a non-oxidizing dielectric, such as silicon nitride. The silicon nitride functions to prevent oxidation of the underlying layers of semiconductor material. Shown also in FIG. 2 is a layer 36 of photoresist which is patterned to define an opening 38 for a CMOS isolating structure, and an opening 40 to define an isolating structure for a bipolar circuit. It is to be understood that in forming bipolar devices with buried collectors, such collector layers would already be formed within the substrate 30.

Next, the wafer is subjected to an etch process for selectively removing that part of the silicon nitride 34 exposed in the respective mask openings 38 and 40. Selective etches are available for permitting the removal of the exposed silicon nitride 34 without the corresponding removal of the underlying silicon oxide 32. The photoresist layer 36 is then removed.

Figure 3:
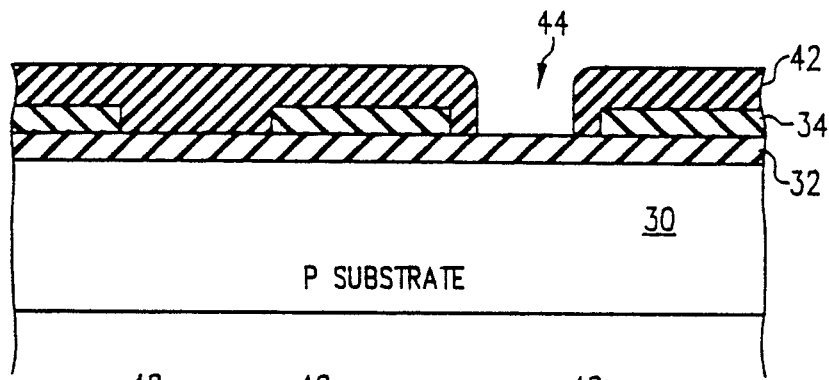

With regard to FIG. 3, there is depicted the silicon nitride layer 34 which is patterned according to the masking step noted above. Processing of the wafer continues by spinning another layer 42 of photoresist on the wafer and patterning it to form openings 44 at those locations where deep trenches are to be formed. In practice, the openings 44 are formed to circumscribe a wafer area which is to be isolated from surrounding wafer areas. The photoresist material 42 is preferably deposited to a depth sufficient to withstand an anisotropic etch described in connection with FIG. 4.

Figure 4:
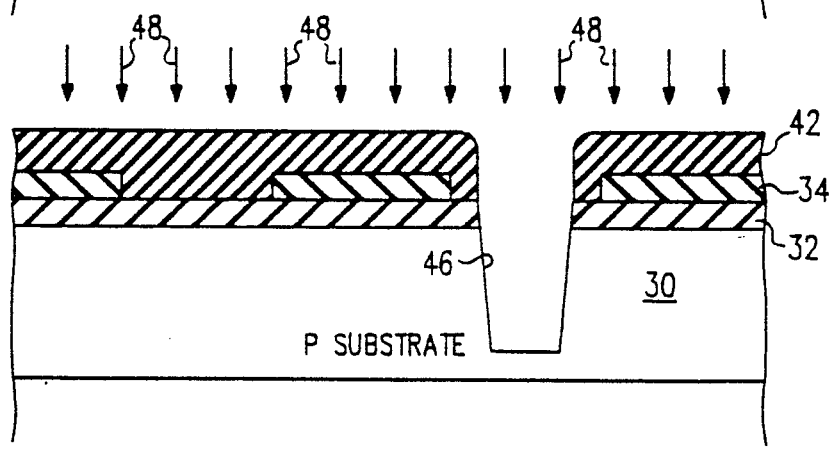

In FIG. 4, the wafer covered by the patterned photoresist 42 is subjected to an anisotropic etch 48, such as a reactive ion etch (RIE), which may comprise an in situ etch whereby both the silicon oxide layer 32 and the underlying substrate material 30 are removed during the same pump down by different processes. As noted above, a portion of the photoresist material 42 may also be removed during the etch process, but such mask layer is of sufficient depth to assure that the masked portions of the wafer remain protected throughout the RIE etch process. In any event, the anisotropic etch 48 forms a trench 46 in the substrate material 30. The etch process is continued until a trench of suitable depth is reached, generally about 4–8 microns for bipolar circuits. The trench 46 is preferably etched to a depth somewhat less than that eventually desired, as a subsequent etch to be described below is effective to extend the trench 46 deeper into the substrate 30.

Figure 5:
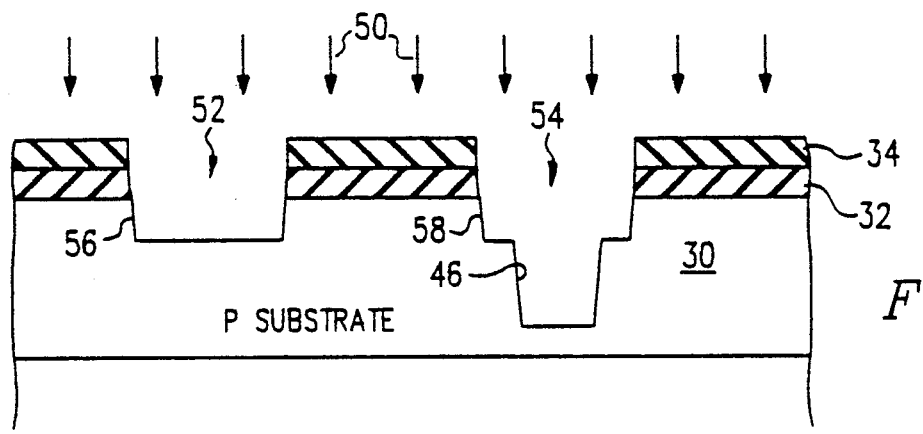

After the first trench etch described above, the photoresist 42 is removed, as noted in FIG. 5. After removal of the photoresist 42, the wafer is again subjected to an etch process 50 selected for first removing the silicon oxide 32 with a higher selectivity to silicon, and then removing the silicon substrate material 30 with a process having a higher silicon etch rate. A high etching rate of the silicon oxide layer 32 is desired so that the removal thereof is achieved with minimal affect on the trench 46. The trench 46 is made deeper as a result of the silicon etch. Such etches are known and readily available to those skilled in the art. As a result of such etch 50, the silicon oxide material 32 defined by the silicon nitride openings 52 and 54 is removed, as well as areas in the silicon substrate 30, forming recesses 56 and 58. As can be appreciated, the silicon nitride layer 34 functions as a mask during the etching process to define the areas for silicon material removal. As a result of the silicon etch 50, the trench 46 is made even deeper by the same amount as the depth of the recessed areas 56 and 58. A trench having stepped sidewalls is thereby formed.

The recessed area 56 defines an area for isolating CMOS and/or portions of bipolar devices, while the trench 46 may function to isolate either CMOS or bipolar devices themselves. In addition, the recessed area 58 formed in alignment with the top of the trench 46 functions as a spacer so that circuits cannot be fabricated too closely to the sidewalls of the trench 46. As is well known in the art, a trench structure utilizing a silicon oxide layer exhibits an external parasitic leakage characteristic, due to a buildup of positive charges within the oxide, thereby facilitating channel formation and presenting the possibility of leakage current around the trench. In those situations where such a leakage is of little or no concern, the trench recessed area 58 can be eliminated by patterning the edges of the silicon nitride 34 in vertical alignment with the intended sidewalls of the trench 46.

According to the invention, the wafer is next subjected to an oxidizing ambient, in which a layer of silicon oxide 60 is formed on the sidewall and bottom surfaces of the trench 46, as well as on the surfaces of the shallow recess 56. The sidewall oxide 60 functions as the primary insulator to provide electrical trench isolation between adjacent circuits on the chip. Preferably, the thickness of the silicon oxide layer 60 should be sufficient to prevent the formation of pin holes therein, but not too thick to create stress and slip problems in the silicon material of the substrate 30. While the silicon oxide insulating layer 60 is preferably formed by utilizing a high temperature steam ambient, such insulation can also be formed by a deposition of an oxide material, such as TEOS.

In those cases where a channel stop is to be formed under the trench 46, an implant can be conducted for driving P-type impurities into the substrate underlying the bottom of the trench 46. The channel stop would also be formed underlying the shallow recesses 56. A directional implant does not enter the sidewalls of the trench 46 or the shallow recess 56 due to the sidewall oxide 60.

Figure 6:
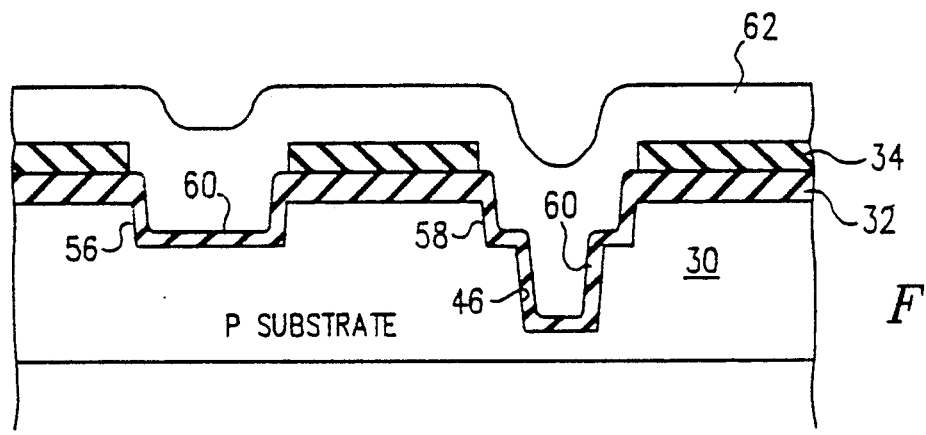

A layer 62 of undoped polysilicon is then deposited over the surface of the wafer, to a depth sufficient to fill both the insulated trench 46 and insulated shallow recess 56. Because polysilicon is normally deposited in a conformal manner, the width of the shallow recess 56 should be somewhat the same as that of the trench 46. In this manner, the filling of both of the isolation structures, from the sidewalls inwardly, will occur at substantially the same rate and thus be filled at about the same time in the process. Hence, an over-deposition of the polysilicon material is not necessary, whereupon subsequent time-consuming etchback steps need not be undertaken to remove excess polysilicon material. The polysilicon deposition can be carried out by standard LPCVD processes. After the polysilicon deposition, the wafer appears as shown in FIG. 6.

The lateral surface deposits of the polysilicon 62 are removed and the wafer is planarized by a conventional resist etch back process. With such a process, the etch rate of the photoresist is selected to be the same as that of the polysilicon 62, thus removing surface irregularities. The resist etch back process is halted when the polysilicon surface is level with the top of the silicon substrate 30.

Figure 7:
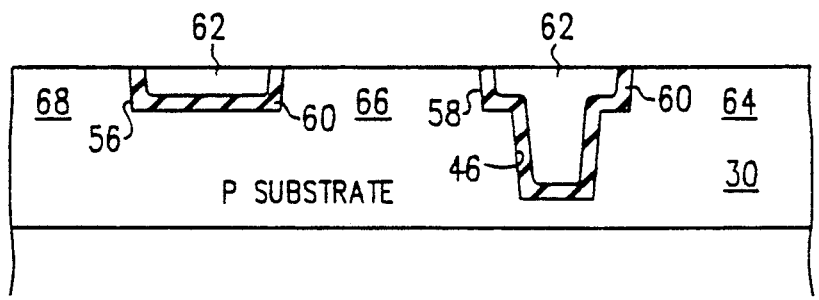

As can be seen in FIG. 7, the silicon nitride layer 34 and the silicon oxide layer 32 have been removed to prepare the wafer for further processing to fabricate circuits in the isolated silicon areas. The silicon nitride 34 may first be removed using a dry etch, such as a plasma or a hot phosphoric acid. The silicon oxide surface layer 32 can be removed with a plasma etch or a hydrofluoric (HF) wash.

Lastly, a dielectric layer or other surface protection barrier (not shown) is deposited over the surface of the wafer to protect the single crystal silicon substrate layer. As can be seen, the semiconductor wafer processed according to the invention provides a first semiconductor area 64 separated by a deep isolation trench 46 from a second semiconductor area 66. Furthermore, the semiconductor area 66 is isolated from yet another semiconductor area 68 by the shallow recess 56. With the widened upper portion of the trench 46, a conductor path is provided which allows an electrical conductor to be formed thereover to reduce the conductor-to-substrate capacitance. With widened conductors, a low resistance high speed signal conductor can be realized.

From the foregoing, disclosed is a technique for simultaneously fabricating an insulated trench structure for providing electrical isolation deep into a semiconductor substrate, as well as a shallower isolation structure which is well adapted for isolating CMOS and similar type circuits. The technical advantage present by the invention is that high quality electrical isolation structures can be simultaneously formed, wherein such structures are uniquely adapted for providing the isolation required by different types of circuits. Yet another technical advantage of the invention is that standard silicon processing apparatus and practices can be employed to fabricate the noted isolation structures. A further technical advantage of the invention is that the traditional LOCOS isolated areas of a chip can be replaced with the polysilicon filled insulated areas which are recessed into the wafer. The advantage of this technique is that bird's beak and bird's head problems are eliminated and thus circuits can be formed adjacent the isolating structures, without concern of the further oxidation and lateral spreading of a thick field oxide insulation. A further technical advantage of the invention is that the polysilicon filled isolation structures of the invention are more easily formed than the LOCOS type of isolation which employs lateral encroachment suppression structures. An important advantage of the invention is that the resultant isolation structure is substantially planar with the silicon surface, thereby facilitating subsequent processing of the wafer.

While the preferred embodiment of the method and apparatus have been disclosed with reference to specific isolating structures, it is to be understood that many changes in detail may be made as a matter of engineering choices without departing from the spirit and scope of the invention, as defined by the appended claims. Indeed, those skilled in the art may prefer to embody the shallow isolating structures in CMOS-type circuits, without also employing the deep trenches. In the alternative, those skilled in the art may prefer to utilize the stepped trench structure to provide isolation as well as a mechanism upon which to form high speed, high current signal conductors.

What is claimed is:

1. An isolating structure for MOS circuits, comprising:
    a shallow recess formed in a semiconductor substrate;
    a thin insulator formed on the surfaces of said recess; and
    a polysilicon dielectric filling the shallow recess.

2. The isolation structure of claim 1, wherein said shallow recess is approximately 0.8 microns deep.

3. The isolation structure of claim 1, wherein said thin insulator is an oxide layer.

4. The semiconductor substrate of claim 1, further comprising:
    an NMOS transistor formed in said semiconductor substrate; and
    a PMOS transistor formed in said semiconductor substrate, said PMOS transistor isolated by said isolating structure from the NMOS transistor.

5. The isolation structure of claim 1, wherein said shallow recess has substantially vertical sidewalls so as to reduce lateral extensions of said isolating structure.

6. The isolation structure of claim 1, wherein said deep trench is formed to a depth of approximately 8 microns.

7. An isolating structure for MOS and bipolar circuits, comprising:
    a shallow recess and a deep trench formed in a semiconductor substrate;

a thin insulation layer formed on the surface of said recess and said deep trench; and polysilicon material filling said recess and said deep trench.

8. An isolating structure for MOS and bipolar circuits, comprising:
- a semiconductor substrate;
- a layer of silicon oxide formed on the semiconductor substrate;
- a layer of non-oxidizing dielectric material formed over said silicon oxide;
- a deep trench formed through said silicon oxide layer and said dielectric material into said semiconductor substrate;
- a shallow recess formed through said layer of silicon oxide and said dielectric material extending into said semiconductor substrate; and
- a non-conductive material filling said deep trench and said recess.

9. An isolation structure for use in a semiconductor substrate, comprising:
- a shallow recess formed in said semiconductor substrate;
- a deep trench formed in said semiconductor substrate;
- a thin insulator formed on the surfaces of said recess and said trench; and
- a polysilicon dielectric filling said recess and said trench.

10. The isolation structure of claim 9, wherein said shallow recess includes substantially vertical sidewalls to reduce a lateral surface area of said substrate required by said structure.

11. The isolation structure of claim 9, wherein said shallow recess is about 0.8 micron deep, and said trench is greater than five microns deep.

12. The isolation structure of claim 9, wherein said trench includes stepped sidewalls such that an upper portion of said trench has a greater lateral area than a lower portion of said trench.

13. The isolation structure of claim 12, wherein said upper trench portion has a lateral area substantially the same as a lateral area of said recess.

14. The isolation structure of claim 9, further including a conductor formed over one said trench or recess structure.

15. An isolating structure for circuits formed in a semiconductor substrate, comprising:
- a shallow recess formed in the semiconductor substrate;
- a thin insulator formed on the surfaces of said recess; and
- a polysilicon dielectric filling the shallow recess.

16. The isolation structure of claim 15, wherein said shallow recess is approximately 0.8 microns deep.

17. The isolation structure of claim 15, wherein said insulator is an oxide layer.

18. The isolating structure of claim 15, wherein said shallow recess has substantially vertical sidewalls so as to reduce lateral extensions of said isolating structure.

19. An isolating structure for circuits formed in a semiconductor substrate, comprising:
- a shallow recess and a deep trench formed in a semiconductor substrate;
- a thin insulation layer formed on the surface of said recess and said deep trench; and
- polysilicon material filling said recess and said deep trench.

20. An isolating structure for circuits formed in a semiconductor substrate, comprising:
- a layer of silicon oxide formed on the semiconductor substrate;
- a layer of non-oxidizing dielectric material formed over said silicon oxide;
- a deep trench formed through said silicon oxide layer and said dielectric material into said semiconductor substrate;
- a shallow recess formed through said layer of silicon oxide and said dielectric material extending into said semiconductor substrate; and
- a non-conductive material filling said deep trench and said recess.

* * * * *